US011175555B2

(12) United States Patent
Chen et al.

(10) Patent No.: US 11,175,555 B2
(45) Date of Patent: Nov. 16, 2021

(54) DISPLAY PANEL

(71) Applicant: AU Optronics Corporation, Hsin-Chu (TW)

(72) Inventors: Ming-Yao Chen, Hsin-Chu (TW); Kuo-Yu Huang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 217 days.

(21) Appl. No.: 16/398,485

(22) Filed: Apr. 30, 2019

(65) Prior Publication Data

US 2019/0339554 A1 Nov. 7, 2019

(30) Foreign Application Priority Data

May 7, 2018 (TW) ................... 107115468

(51) Int. Cl.
| | | |
|---|---|---|
| *G02F 1/1368* | (2006.01) | |
| *G02F 1/1335* | (2006.01) | |
| *G02F 1/1362* | (2006.01) | |
| *H01L 27/12* | (2006.01) | |
| *H01L 29/786* | (2006.01) | |

(52) U.S. Cl.
CPC ...... *G02F 1/1368* (2013.01); *G02F 1/133553* (2013.01); *G02F 1/136286* (2013.01); *H01L 27/124* (2013.01); *H01L 27/1225* (2013.01); *H01L 27/1251* (2013.01); *H01L 29/7869* (2013.01); *H01L 29/78675* (2013.01); *G02F 2201/123* (2013.01); *G02F 2203/09* (2013.01)

(58) Field of Classification Search
None
See application file for complete search history.

(56) References Cited

U.S. PATENT DOCUMENTS

| | | | |
|---|---|---|---|
| 9,368,631 B2 | 6/2016 | Lin et al. | |
| 10,186,528 B2 | 1/2019 | Lee et al. | |
| 2007/0228411 A1* | 10/2007 | Lee | ...................... G09G 3/3659 257/147 |
| 2009/0040410 A1* | 2/2009 | Woo | .................. G02F 1/133555 349/43 |

(Continued)

FOREIGN PATENT DOCUMENTS

| | | |
|---|---|---|
| CN | 101458429 A | 6/2009 |
| CN | 102566132 A | 7/2012 |
| TW | I608610 B | 12/2017 |

OTHER PUBLICATIONS

China Patent Office "Office Action" dated Sep. 30, 2020, China.

(Continued)

*Primary Examiner* — Ryan Crockett
(74) *Attorney, Agent, or Firm* — WPAT, PC

(57) ABSTRACT

A display panel includes a substrate, at least one first transistor, and at least one second transistor. The substrate includes at least one reflective region and at least one transmissible region. The first transistor is configured on the substrate and located on the corresponding reflective region. Each of the first transistors includes a first active layer. The second transistor is configured on the substrate and located on the corresponding transmissible region. Each of the second transistors includes a second active layer. A material of the first active layer is different from a material of the second active layer.

13 Claims, 9 Drawing Sheets

(56) References Cited

U.S. PATENT DOCUMENTS

| | | | |
|---|---|---|---|
| 2012/0002127 A1* | 1/2012 | Yamazaki | G09G 3/3688 |
| | | | 349/43 |
| 2013/0277691 A1* | 10/2013 | Park | G02F 1/13624 |
| | | | 257/88 |
| 2015/0055051 A1 | 2/2015 | Osawa et al. | |
| 2015/0243685 A1* | 8/2015 | Lee | H01L 29/78675 |
| | | | 257/43 |
| 2016/0299381 A1* | 10/2016 | Lu | G02F 1/133553 |
| 2017/0162606 A1* | 6/2017 | Yan | H01L 29/78648 |
| 2018/0031881 A1* | 2/2018 | Kubota | G02F 1/1339 |

OTHER PUBLICATIONS

Taiwan Intellectual Property Office, "Office Action", dated Feb. 23, 2019.

Hsiao-Yi Lin et al., U.S. Appl. No. 10/419,889, filed Apr. 22, 2003.

\* cited by examiner

– 1 –

DISPLAY PANEL

BACKGROUND

Technical Field

The present invention relates to a display panel, and in particular, to a display panel including a reflective region and a transmissible region.

Related Art

Recently, with the popularity of portable electronic products, demands for display devices that can be applied to outdoor and indoor environments are also increasing. A transflective liquid crystal display (TRLCD) has advantages of both a transmissible liquid crystal display and a reflective liquid crystal display, and may use both transmitted light from a backlight module and reflected light from an ambient light source, so that the liquid crystal display can still maintain some visibility in strong outdoor light, and can further reflect display information by using ambient light when a power source of the backlight module is closed, to reduce power consumption of the panel. Therefore, the TRLCD has become a popular type of liquid crystal display.

However, modern people are more focused on display quality, and expect clearer images when the panel is playing dynamic images, but considering the definition of images may need to consume considerable power. Therefore, the current TRLCD has not achieved requirements of improving image quality and saving power.

SUMMARY

The present disclosure relates to a display panel. The display panel of the present disclosure includes a reflective region and a transmissible region, and different types of first transistors and second transistors are selected for the reflective region and the transmissible region. By means of features of different materials of the first transistors and the second transistors, the reflective region and the transmissible region can separately exercise effects of power saving and clear display quality.

According to an aspect of the present disclosure, a display panel is provided. The display panel includes a substrate, at least one first transistor, and at least one second transistor. The substrate includes at least one reflective region and at least one transmissible region. The first transistor is configured on the substrate and located on the corresponding reflective region, and each of the first transistors includes a first active layer. The second transistor is configured on the substrate and located on the corresponding transmissible region, and each of the second transistors includes a second active layer. A material of the first active layer is different from a material of the second active layer.

To better understand the foregoing and other aspects of the present invention, the following provides detailed description by using specific embodiments and with reference to the accompanying drawings.

DETAILED DESCRIPTION

The present disclosure relates to a display panel. The display panel of the present disclosure includes a reflective region and a transmissible region, and different types of first transistors and second transistors are selected for the reflective region and the transmissible region. Because materials used by the first transistors can reduce the current leakage of the display panel, and material used by the second transistors can improve the frame rate of the display panel, effects of both saving power and promoting image quality can be achieved.

Figure 1:
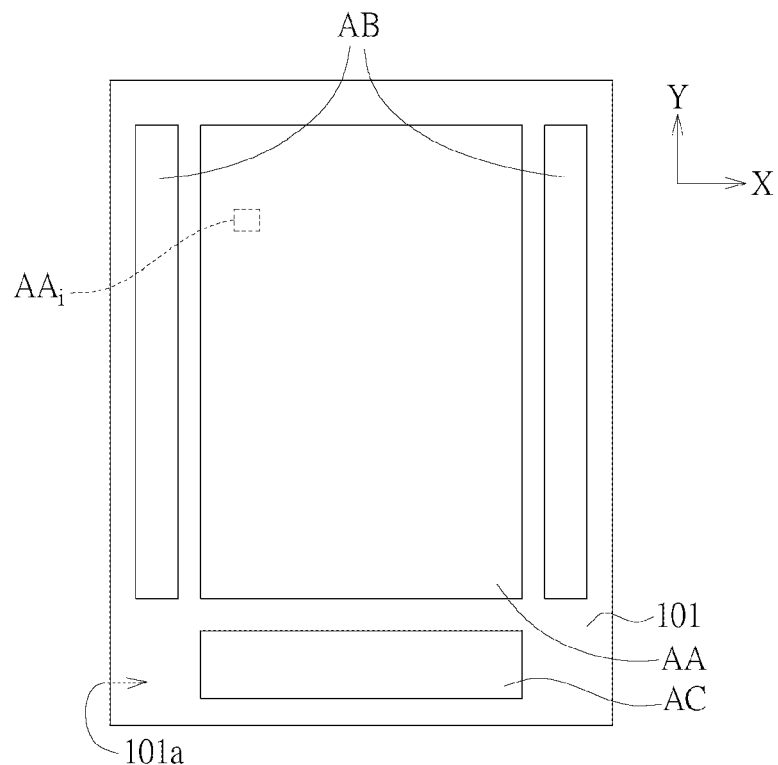
FIG. 1 illustrates a top view of a display panel according to an embodiment of the present disclosure.

FIG. 1 illustrates a top view of a display panel 10 according to an embodiment of the present disclosure.

Referring to FIG. 1, the display panel 10 includes a substrate 101, and a surface 101a of the substrate 101 includes a visible region AA, a peripheral circuit region AB, and a drive circuit region AC. The substrate 101 may be paired with another substrate (not illustrated), and a liquid crystal layer (not illustrated) may exist between the substrate 101 and the another substrate. The surface 101a is a surface facing the liquid crystal layer and the another substrate, namely, an inner side of the substrate 101. The visible region AA of the substrate 101 includes reflective regions Rr and transmissible regions Tr, as shown by the block AAi of a partially visible region AA in FIG. 2.

Figure 2:
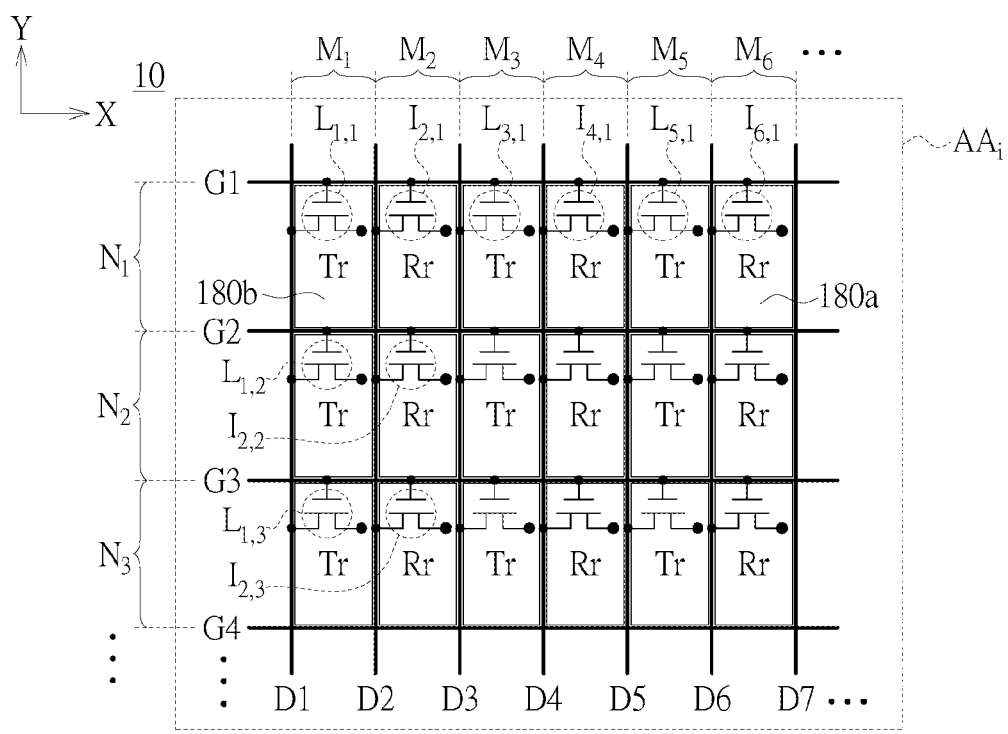
FIG. 2 illustrates a schematic view of a pixel layout of a display panel according to an embodiment of the present disclosure.

FIG. 2 illustrates a schematic view of a pixel layout of the display panel 10 according to an embodiment of the present disclosure.

Referring to FIG. 2, the display panel 10 includes first transistors I (such as $I_{2,1}$, $I_{4,1}$, $I_{6,1}$ ... $I_{2,2}$, $I_{4,2}$, $I_{6,2}$ ... , $I_{2,3}$, $I_{4,3}$, $I_{6,3}$ ...) and second transistors L (such as $L_{1,1}$, $L_{3,1}$, $L_{5,1}$ ... $L_{1,2}$, $L_{3,2}$, $L_{5,2}$ ... $L_{1,3}$, $L_{3,3}$, $L_{5,3}$). The first transistors I are configured on the surface 101a of the substrate 101 and located on the corresponding reflective regions Rr. The second transistors L are configured on the surface 101a of the substrate 101 and located on the corresponding transmissible regions Tr. The first transistor I includes a first active layer; and the second transistor L includes a second active layer. A material of the first active layer may be different from a material of the second active layer. In an embodiment, the material of the first active layer includes an oxide semiconductor, and the oxide semiconductor may be a mixture of oxides of group 2 to 4 elements in the periodic table of elements, such as IGZO, IZTO, IGTO, IZO, IGO, ZTO, and SnO. The material of the second active layer includes polysilicon. In other words, the first transistor I may be an oxide semiconductor transistor, and the second transistor L may be a polysilicon transistor.

Compared with an oxide semiconductor transistor and an amorphous silicon transistor, a polysilicon transistor has a higher charging rate, can provide a better frame rate of the display panel and improve the phenomenon of motion blur, and has excellent pixel quality when rendering dynamic images. Compared with a polysilicon semiconductor transistor and an amorphous silicon transistor, an oxide semiconductor transistor has a lower current leakage, and can still maintain static images under an operation of reducing the frame rate, and achieve the objective of reducing power consumption of the display panel. In the present disclosure, an oxide semiconductor transistor is selected for a first transistor I corresponding to the reflective region, and a polysilicon transistor is selected for a second transistor L corresponding to the transmissible region, so that by means of the feature of its low current leakage, the oxide semiconductor transistor can maintain an operation of a low frame rate when static images need to be rendered, to achieve a power-saving requirement, and by means of the feature of its high charging capability, the polysilicon transistor can execute an operation of a high frame rate when dynamic images need to be rendered, to achieve the objective of improving image quality of a video. Therefore, a display panel having excellent image quality and power-saving effects can be provided.

Referring to FIG. 2, the display panel 10 includes a plurality of data lines D1, D2, D3, D4, D5, D6, D7 . . . and a plurality of scanning lines G1, G2, G3, G4 . . . that are interlaced. The substrate 101 is divided into a plurality of pixel groups, and each of the pixel groups includes a plurality of pixels (such as a red pixel R, a green pixel G, and a blue pixel B (not illustrated)). The data lines D1, D2, D3, D4, D5, D6, D7 . . . for example, extend along a Y direction and are arranged sequentially along an X direction. The scanning lines G1, G2, G3, G4 . . . for example, extend along the X direction and are arranged sequentially along the Y direction. The X direction may be perpendicular to the Y direction. Each of the first transistors $I_{2,1}, I_{4,1}, I_{6,1} \ldots I_{2,2}, I_{4,2}, I_{6,2} \ldots, I_{2,3}, I_{4,3}, I_{6,3} \ldots$ and each of the second transistors $L_{1,1}, L_{3,1}, L_{5,1} \ldots L_{1,2}, L_{3,2}, L_{5,2} \ldots L_{1,3}, L_{3,3}, L_{5,3}$ are coupled to the corresponding data lines D1, D2, D3, D4, D5, D6, D7 . . . , scanning lines G1, G2, G3, G4 . . . , and pixels. The reflective regions Rr and the transmissible regions Tr are arranged into a matrix including a plurality of columns and a plurality of rows and corresponding to the pixels. According to the difference of reflective regions Rr and transmissible regions Tr on which the pixels are located, each of the pixels are separately corresponding to a first pixel electrode 180a and a second pixel electrode 180b. The matrix, for example, has an $M_1^{st}$ column, an $M_2^{nd}$ column, an $M_3^{rd}$ column . . . an $M_m^{th}$ column, an $M_{m+1}^{th}$ column . . . , and an $N_1^{st}$ row of, $N_2^{nd}$ row of, $N_3^{rd}$ row of . . . an $N_n^{th}$ column, an $N_{n+1}^{th}$ column . . . m and n are positive integers. Each of the data lines D1, D2, D3, D4, D5, D6, D7 . . . is only coupled to the first transistors $I_{2,1}, I_{4,1}, I_{6,1} \ldots I_{2,2}, I_{4,2}, I_{6,2} \ldots, I_{2,3}, I_{4,3}, I_{6,3} \ldots$ or the second transistors $L_{1,1}, L_{3,1}, L_{5,1} \ldots L_{1,2}, L_{3,2}, L_{5,2} \ldots L_{1,3}, L_{3,3}, L_{5,3}$. For example, the data line D1 is only coupled to the second transistors $L_{1,1}, L_{1,2}, L_{1,3} \ldots$ , but is not coupled to any first transistor I. The data line D2 is only coupled to the first transistors $I_{2,1}, I_{2,2}, I_{2,3} \ldots$ , but is not coupled to any second transistor L. Each of the scanning lines G1, G2, G3 . . . may be coupled to the first transistor and the second transistor. For example, the scanning line G1 is coupled to the first transistors $I_{2,1}, I_{4,1}, I_{6,1} \ldots$ and the second transistors $L_{1,1}, L_{3,1}, L_{5,1} \ldots$ .

In the present disclosure, the data lines D1, D2, D3, D4 . . . may be in a sequence relationship. For example, in an embodiment, the data line D1 may represent an $x^{th}$ data line, the data line D2 may represent an $(x+1)^{th}$ data line, the data line D3 may represent an $(x+2)^{th}$ data line, the data line D4 may represent an $(x+3)^{th}$ data line, and so on. In another embodiment, the data line D1 may represent an $(x-1)^{th}$ data line, the data line D2 may represent an $x^{th}$ data line, the data line D3 may represent an $(x+1)^{th}$ data line, the data line D4 may represent an $(x+2)^{th}$ data line, and so on. However, the present disclosure is not limited thereto. x may be any positive integer.

In this embodiment, the first transistor $I_{2,1}$ is located between the data line D2 and the data line D3 and coupled to the data line D2. The second transistor $L_{3,1}$ is located between the data line D3 and the data line D4 and coupled to the data line D3. In addition, both the first transistor $I_{2,1}$ and the second transistor $L_{3,1}$ are coupled to the scanning line G1.

Figure 3:
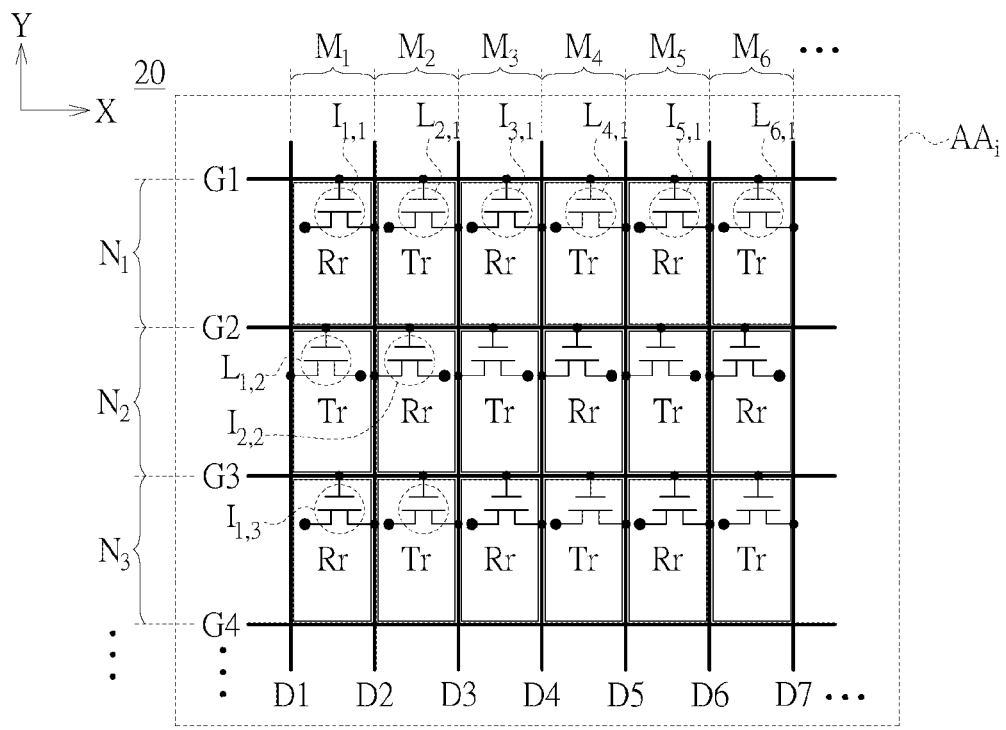
FIG. 3 illustrates a schematic view of a pixel layout of a display panel according to another embodiment of the present disclosure.

FIG. 3 illustrates a schematic view of a pixel layout of a display panel 20 according to another embodiment of the present disclosure, and is similar to the region of the block AAi of the partially visible region AA in FIG. 2. The difference from the embodiment of FIG. 2 lies in: a same column of pixels may set the reflective region Rr and the transmissible region Tr alternatively.

Referring to FIG. 3, an $M_1^{st}$ column and $N_1^{st}$ row of first transistor $I_{1,1}$ and an $M_1^{st}$ column and $N_2^{nd}$ row of second transistor $L_{1,2}$ are located between the data line D1 and the data line D2, the $M_1^{st}$ column and $N_1^{st}$ row of first transistor $I_{1,1}$ is coupled to the data line D2, and the $M_1^{st}$ column and $N_2^{nd}$ row of second transistor $L_{1,2}$ is coupled to the data line D1. An $M_2^{nd}$ column and $N_1^{st}$ row of second transistor $L_{2,1}$ and an $M_2^{nd}$ column and $N_2^{nd}$ row of first transistor $I_{2,2}$ are located between the data line D2 and the data line D3, the $M_2^{nd}$ column and $N_1^{st}$ row of second transistor $L_{2,1}$ is coupled to the data line D3, and the $M_2^{nd}$ column and $N_2^{nd}$ row of first transistor $I_{2,2}$ is coupled to the data line D2. The data line D1 is only coupled to the second transistor $L_{1,2} \ldots$ , but is not coupled to any first transistor I. The data line D2 is only coupled to the first transistors $I_{1,1}, I_{2,2}$, and $I_{1,3} \ldots$ , but is not coupled to any second transistor L. Compared with the pixel layout of the display panel 10 in FIG. 2, because in the pixel layout of the display panel 20 in FIG. 3, a same column of pixels are not all corresponding to a same type of transistors, but two different types of transistors (first transistor and second transistor) are separated, so that a uniform display effect can be achieved.

In this embodiment, each of the scanning lines G1, G2, G3 . . . may be coupled to the first transistor and the second transistor. For example, the scanning line G1 is coupled to the first transistors $I_{1,1}, I_{3,1}, I_{5,1} \ldots$ and the second transistors $L_{2,1}, L_{4,1}, L_{6,1} \ldots$ .

Figure 4:
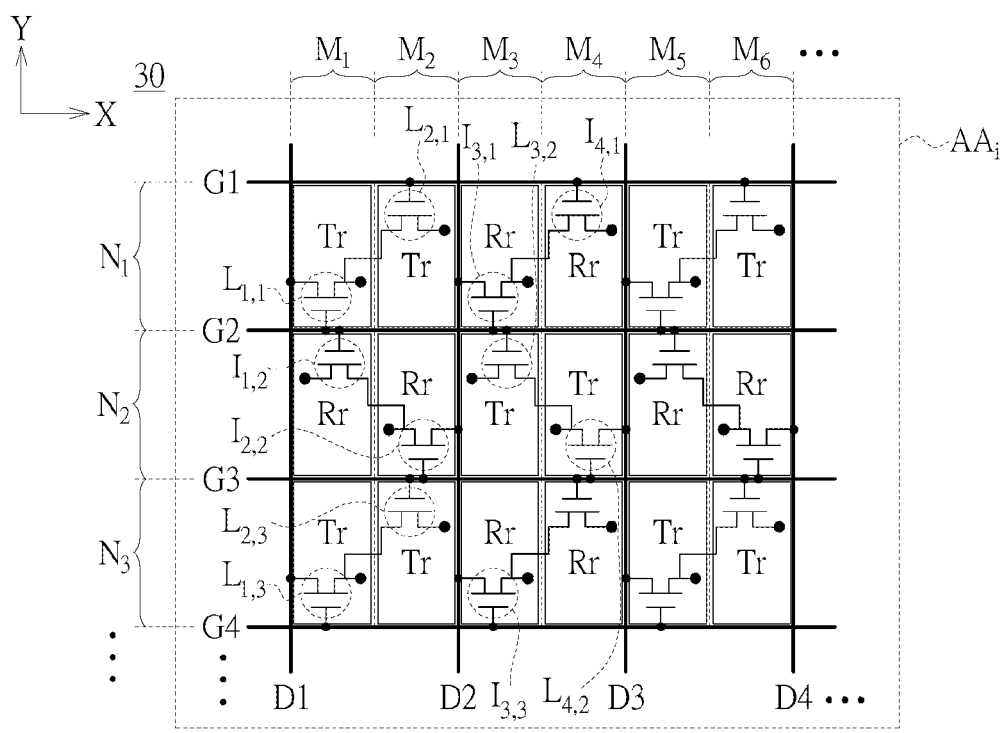
FIG. 4 illustrates a schematic view of a pixel layout of a display panel according to another embodiment of the present disclosure.

FIG. 4 illustrates a schematic view of a pixel layout of a display panel 30 according to another embodiment of the present disclosure, and is similar to the region of the block AAi of the partially visible region AA in FIG. 2. The difference from the embodiment of FIG. 2 lies in: a same column of pixels may set the reflective region Rr and the transmissible region Tr alternatively, and each of the data lines may be coupled to two transistors in a same row of pixels.

Referring to FIG. 4, an $M_1^{st}$ column and $N_1^{st}$ row of second transistor $L_{1,1}$, an $M_2^{nd}$ column and $N_1^{st}$ row of second transistor $L_{2,1}$, an $M_1^{st}$ column and $N_2^{nd}$ row of first transistor $I_{1,2}$, and an $M_2^{nd}$ column and $N_2^{nd}$ row of first transistor $I_{2,2}$ are located between the data line D1 and the data line D2. The second transistor $L_{2,1}$ is coupled to the data line D1 by using the second transistor $L_{1,1}$. The first transistor $I_{1,2}$ is coupled to the data line D2 by using the first transistor $I_{2,2}$. An $M_3^{rd}$ column and $N_1^{st}$ row of first transistor $I_{3,1}$, an $M_4^{th}$ column and $N_1^{st}$ row of first transistor $I_{4,1}$, an $M_3^{rd}$ column and $N_2^{nd}$ row of second transistor $L_{3,2}$, and an $M_4^{th}$ column and $N_2^{nd}$ row of second transistor $L_{4,2}$ are located between the data line D2 and the data line D3. The first transistor $I_{4,1}$ is coupled to the data line D2 by using the first transistor $I_{3,1}$. The second transistor $L_{3,2}$ is coupled to the data line D3 by using the second transistor $L_{4,2}$. The data line D1 is only coupled to the second transistors $L_{1,1}$, $L_{2,1}$, $L_{1,3}$, $L_{2,3}$ ..., but is not coupled to any first transistor I. The data line D2 is only coupled to the first transistors $I_{3,1}$, $I_{4,1}$, $I_{1,2}$, $I_{2,2}$ ..., but is not coupled to any second transistor L.

In an embodiment, each of the scanning lines G1, G2, G3 ... may be coupled to the first transistor and the second transistor. For example, the scanning line G1 is coupled to the first transistor $I_{4,1}$ ... and the second transistor $L_{2,1}$ .... A pixel may exist between the first transistor $I_{4,1}$ and the second transistor $L_{2,1}$. The scanning line G2 is coupled to the first transistors $I_{1,2}$, $I_{3,1}$ ... and the second transistors $L_{1,1}$, $L_{3,2}$ .... The scanning line G2 is located between the second transistor $L_{1,1}$ and the first transistor $I_{1,2}$ and located between the first transistor $I_{3,1}$ and the second transistor $L_{3,2}$.

The display panel 30 of this embodiment uses a half source line driving (HSD) pixel layout, which includes fewer data lines compared with the embodiments of the display panels 10 and 20, so that the amounts of pins and pads of an integrated circuit can be reduced, the area of a frame of the display panel can be smaller, and more costs can be reduced.

Figure 5:
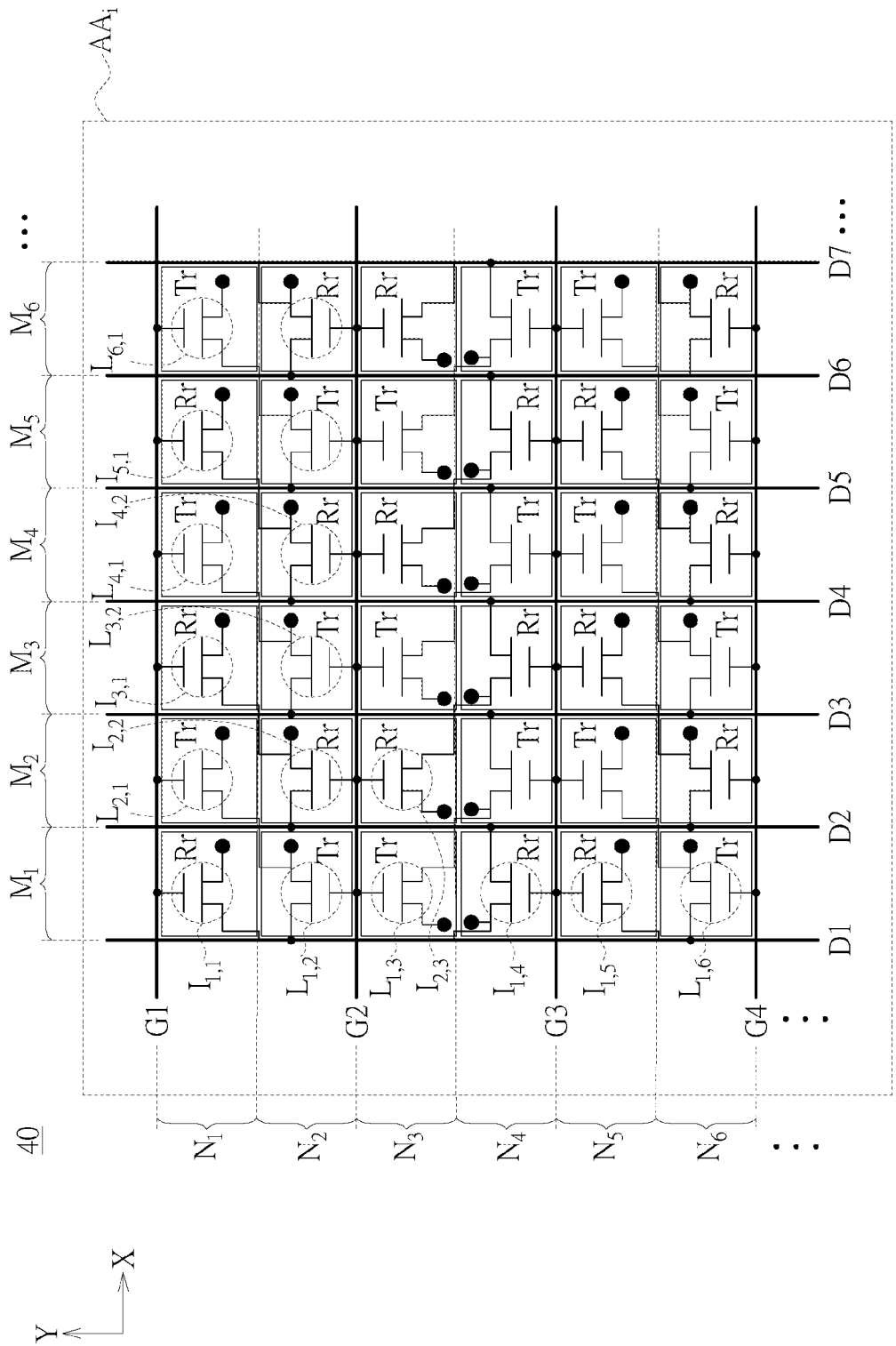
FIG. 5 illustrates a schematic view of a pixel layout of a display panel according to another embodiment of the present disclosure.

FIG. 5 illustrates a schematic view of a pixel layout of a display panel 40 according to another embodiment of the present disclosure, and is similar to the region of the block AAi of the partially visible region AA in FIG. 2. The difference from the embodiment of FIG. 2 lies in: each column of pixels include two different types of transistors (first transistor I and second transistor L), and each of the data lines may be coupled to two transistors in neighboring two rows of pixels.

Referring to FIG. 5, an $M_1^{nd}$ column and $N_2^{nd}$ row of first transistor $I_{2,2}$ and an $M_3^{rd}$ column and $N_1^{st}$ row of first transistor $I_{3,1}$ are located between the data line D2 and the data line D4, namely, an $M_2^{nd}$ column and $N_2^{nd}$ row of first transistor $I_{2,2}$ is located between the data line D2 and the data line D3, and an $M_3^{rd}$ column and $N_1^{st}$ row of first transistor $I_{3,1}$ is located between the data line D3 and the data line D4. The $M_3^{rd}$ column and $N_1^{st}$ row of first transistor $I_{3,1}$ is coupled to the data line D2 by using the $M_2^{nd}$ column and $N_2^{nd}$ row of first transistor $I_{2,2}$. An $M_3^{rd}$ column and $N_2^{nd}$ row of second transistor $L_{3,2}$ and an $M_4^{th}$ column and $N_1^{st}$ row of second transistor $L_{4,1}$ are located between the data line D3 and the data line D5, namely, an $M_3^{rd}$ column and $N_2^{nd}$ row of second transistor $L_{3,2}$ is located between the data line D3 and the data line D4, and an $M_4^{th}$ column and $N_1^{st}$ row of second transistor $L_{4,1}$ are located between the data line D4 and the data line D5. The $M_4^{th}$ column and $N_1^{st}$ row of second transistor $L_{4,1}$ is coupled to the data line D3 by using the $M_3^{rd}$ column and $N_2^{nd}$ row of second transistor $L_{3,2}$.

In this embodiment, each of the scanning lines G1, G2, G3 ... may be coupled to the first transistor and the second transistor. For example, the scanning line G1 is coupled to the first transistors $I_{1,1}$, $I_{3,1}$, $I_{5,1}$ ... and the second transistors $L_{2,1}$, $L_{4,1}$, $L_{6,1}$ .... The scanning line G2 is coupled to the $N_2^{nd}$ row of first transistors $I_{2,2}$, $I_{4,2}$ ... and second transistors $L_{1,2}$, $L_{3,2}$ ..., and is coupled to the $N_3^{rd}$ row of first transistor $I_{2,3}$ ... and second transistor $L_{1,3}$.

Figure 6:
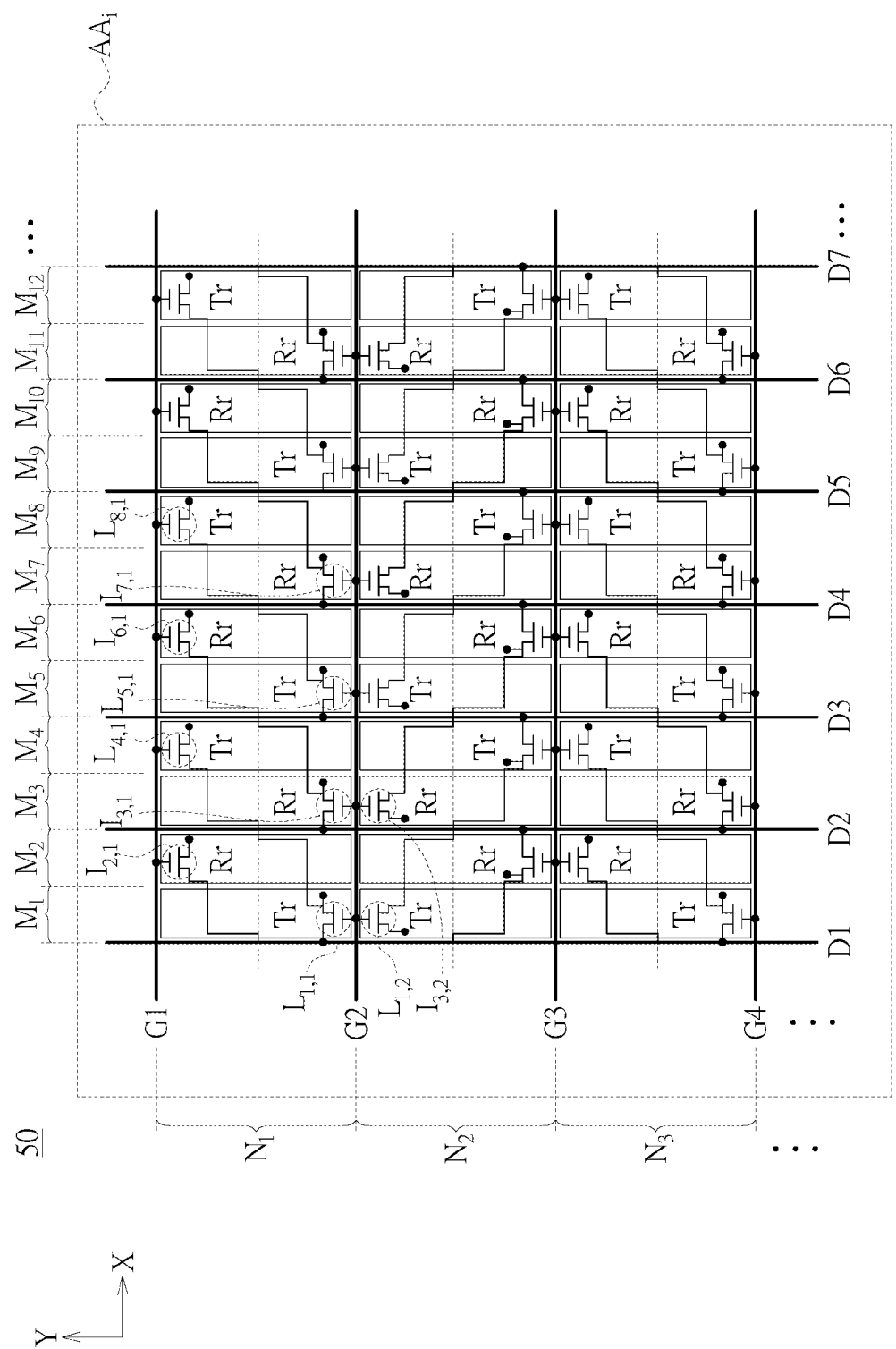
FIG. 6 illustrates a schematic view of a pixel layout of a display panel according to another embodiment of the present disclosure.

FIG. 6 illustrates a schematic view of a pixel layout of a display panel 50 according to another embodiment of the present disclosure, and is similar to the region of the block AAi of the partially visible region AA in FIG. 2. The difference from the embodiment of FIG. 2 lies in: each column of pixels only has one type of transistor, for example, an $M_1^{st}$ column of pixels have a second transistor L, an $M_1^{nd}$ column of pixels have a first transistor I ..., and each of the data lines may be coupled to two transistors in a same row of pixels.

Referring to FIG. 6, an $M_3^{rd}$ column and $N_1^{st}$ row of first transistor $I_{3,1}$ and an $M_6^{th}$ column and $N_1^{st}$ row of first transistor $I_{6,1}$ are located between the data line D2 and the data line D4. The $M_6^{th}$ column and $N_1^{st}$ row of first transistor $I_{6,1}$ is coupled to the data line D2 by using the $M_3^{rd}$ column and $N_1^{st}$ row of first transistor $I_{3,1}$. An $M_5^{th}$ column and $N_1^{st}$ row of second transistor $L_{5,1}$ and an $M_8^{th}$ column and $N_1^{st}$ row of second transistor $L_{8,1}$ are located between the data line D3 and the data line D5. The $M_8^{th}$ column and $N_1^{st}$ row of second transistor $L_{8,1}$ is coupled to the data line D3 by using the $M_5^{th}$ column and $N_1^{st}$ row of second transistor $L_{5,1}$.

In an embodiment, each of the scanning lines G1, G2, G3 ... may be coupled to the first transistor and the second transistor. For example, the scanning line G1 is coupled to the first transistors $I_{2,1}$, $I_{6,1}$ ... and the second transistors $L_{4,1}$, $L_{8,1}$ .... The scanning line G2 is coupled to the $N_1^{st}$ row of first transistors $I_{3,1}$, $I_{7,1}$ ... and second transistors $L_{1,1}$, $L_{5,1}$ ..., and coupled to the $N_2^{nd}$ row of first transistor $I_{3,2}$ ... and second transistor $L_{1,2}$.

Because the display panel 50 of this embodiment has both the reflective region Rr and the transmissible region Tr in one pixel, the display panel 50 has better resolution compared with the embodiments of the display panels 10, 20, and 30 in which one pixel region has only the reflective region Rr or only the transmissible region Tr.

Figure 7:
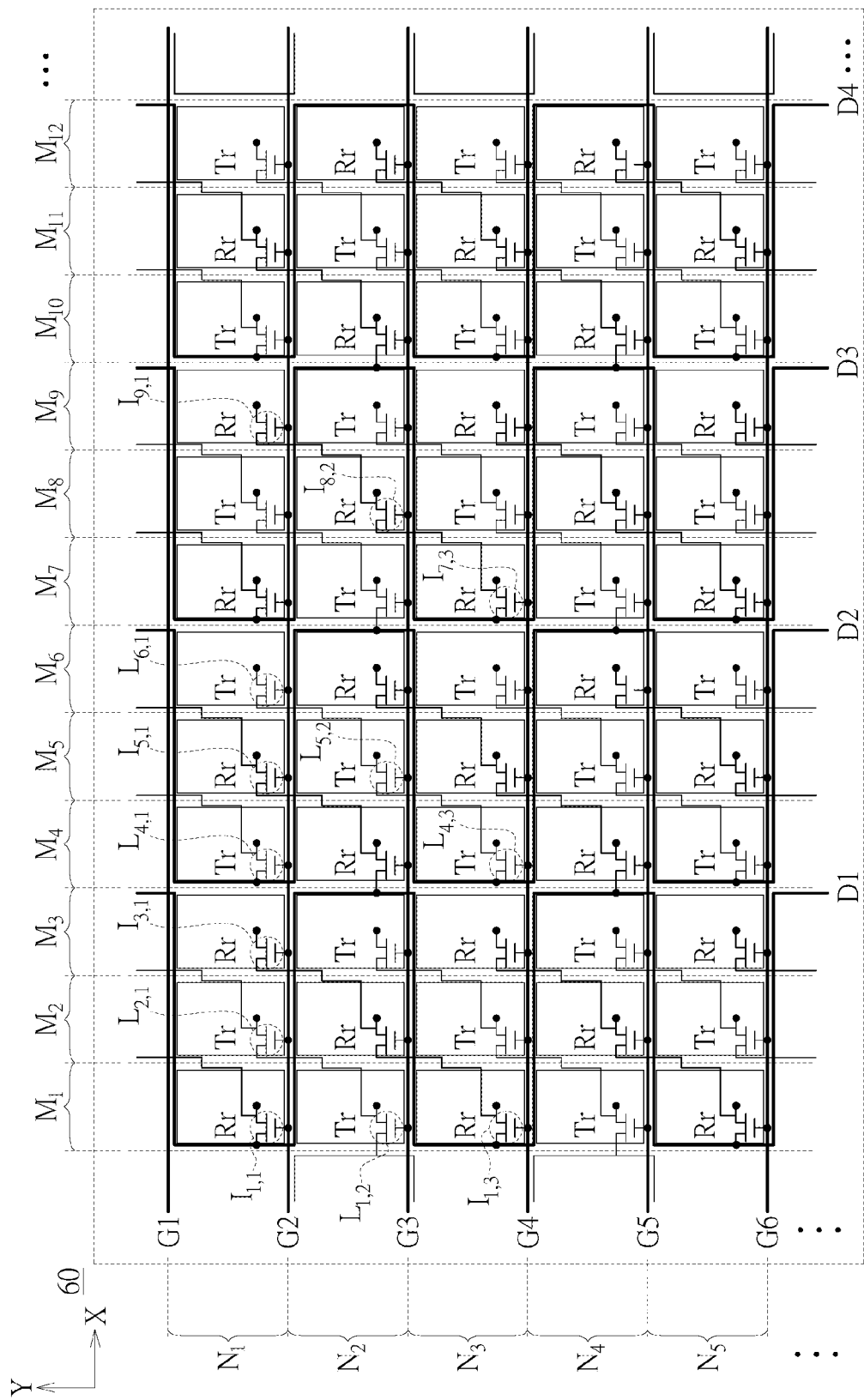
FIG. 7 illustrates a schematic view of a pixel layout of a display panel according to another embodiment of the present disclosure.

FIG. 7 illustrate a schematic view of a pixel layout of a display panel 60 according to another embodiment of the present disclosure, and is similar to the region of the block AAi of the partially visible region AA in FIG. 2. The difference from the embodiment of FIG. 2 lies in: a same column of pixels may set the reflective regions Rr and the transmissible regions Tr alternatively, each of the data lines may be coupled to three successive different rows of pixels of transistors. Some of the data lines D1, D2, D3, D4 ... extend along an X direction, and some extend along a Y direction and have a winding shape.

Referring to FIG. 7, an $M_8^{th}$ column and $N_2^{nd}$ row of first transistor $I_{8,2}$ is located between the data line D2 and the data line D3, and an $M_7^{th}$ column and $N_3^{rd}$ row of first transistor $I_{7,3}$ and an $M_9^{th}$ column and $N_1^{st}$ row of first transistor $I_{9,1}$ is located between the data line D3 and the data line D4. The first transistor $I_{9,1}$ is coupled to the data line D3 by using the first transistor $I_{7,3}$ and the first transistor $I_{8,2}$. An $M_5^{th}$ column and $N_2^{nd}$ row of second transistor $L_{5,2}$ is located between the data line D1 and the data line D2, and an $M_4^{th}$ column and $N_3^{rd}$ row of second transistor $L_{4,3}$ and an $M_6^{th}$ column and $N_1^{st}$ row of second transistor $L_{6,1}$ are located between the data line D2 and the data line D3. The second transistor $L_{6,1}$ is coupled to the data line D2 by using the second transistor $L_{4,3}$ and the second transistor $L_{5,2}$.

In an embodiment, each of the scanning lines G1, G2, G3 . . . may be coupled to the first transistor and the second transistor. For example, the scanning line G2 is coupled to the first transistors $I_{1,1}$, $I_{3,1}$, $I_{5,1}$ . . . and the second transistors $L_{2,1}$, $L_{4,1}$, $L_{6,1}$ . . . .

The display panel 60 of this embodiment uses a one third source line driving (OTSD) pixel layout, which has fewer data lines compared with the embodiments of the display panels 10, 20, and 30, so that the consumption of pins and pads of an integrated circuit can be reduced, the area of a frame of the display panel can be smaller, and more costs can be reduced.

Figure 8:
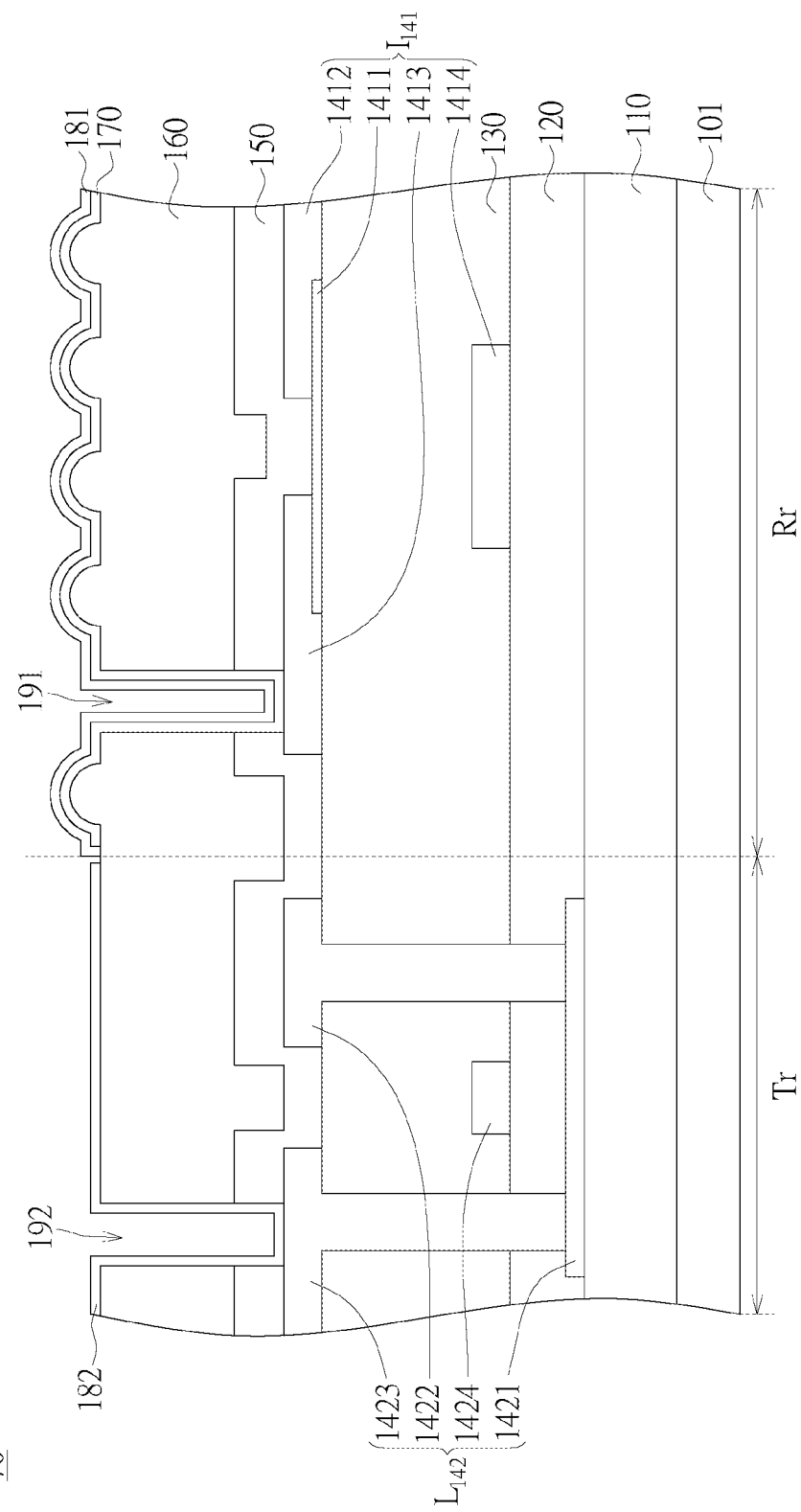
FIG. 8 illustrates a partial sectional view of a display panel according to an embodiment of the present disclosure.

FIG. 8 illustrates a partial sectional view of a display panel 70 according to an embodiment of the present disclosure.

Referring to FIG. 8, FIG. 8 illustrates a partial sectional view of a corresponding first transistor $I_{141}$ and a corresponding second transistor $L_{142}$ of the display panel 70. The display panel 70 includes a substrate 101, a buffer layer 110, a first insulating layer 120, a second insulating layer 130, a first transistor $I_{141}$, a second transistor $L_{142}$, a first protective layer 150, a second protective layer 160, a reflective layer 170, a first pixel electrode 181, and a second pixel electrode 182. The substrate 101 includes a reflective region Rr and a transmissible region Tr. The buffer layer 110 is formed on the substrate 101. The first insulating layer 120 is formed on the buffer layer 110. The second insulating layer 130 is formed on the first insulating layer 120. The first protective layer 150 is formed on the second insulating layer 130. The first transistor $I_{141}$ and the second transistor $L_{142}$ are configured on the substrate 101, formed between the buffer layer 110 and the first protective layer 150, and separately located on the corresponding reflective region Rr and transmissible region Tr. The second protective layer 160 is formed on the first protective layer 150, the reflective layer 170 is formed on the second protective layer 160 of the reflective region Rr, and the first pixel electrode 181 is formed on the reflective layer 170.

The first transistor $I_{141}$ includes a first active layer $I_{411}$, a first source 1412, a first drain 1413, and a first gate 1414. The first gate 1414 is located on a lower side of the first active layer $I_{411}$. The first transistor $I_{141}$ is also referred to as a bottom gate transistor. The second transistor $L_{142}$ includes a second active layer 1421, a second source 1422, a second drain 1423, and a second gate 1424. The second gate 1424 is located on an upper side of the second active layer 1421. The second transistor $L_{142}$ is also referred to as a top gate transistor. The first pixel electrode 181 and the second pixel electrode 182 are respectively coupled to the first drain 1413 and the second drain 1423 by using through holes 191 and 192.

A material of the first active layer 1411 includes an oxide semiconductor, and the oxide semiconductor may be a mixture of oxides of group 2 to 4 elements in the periodic table of elements, such as IGZO, IZTO, IGTO, IZO, IGO, ZTO, and SnO. The material of the second active layer 1421 includes polysilicon. Therefore, the display panel 70 of this embodiment uses an oxide semiconductor transistor of a bottom gate in the visible region AA to match a polysilicon transistor of a top gate.

In this embodiment, the substrate 101 may be made of glass. The buffer layer 110 may be made of an inorganic dielectric material. The first insulating layer 120 may be made of oxides, such as SiO. The first source 1412, the first drain 1413, the first gate 1414, the second source 1422, the second drain 1423, and the second gate 1424 may be made of metal.

Figure 9:
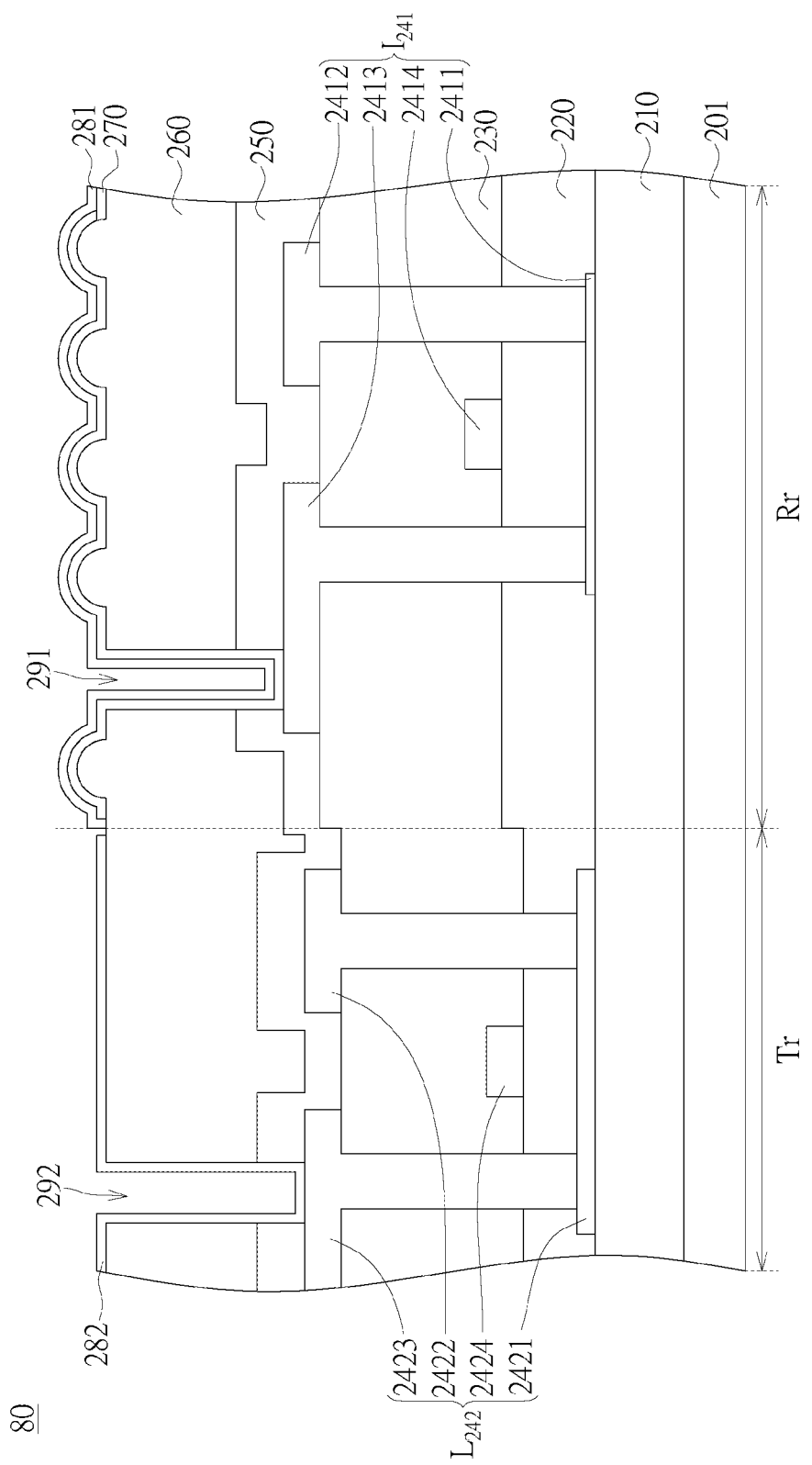
FIG. 9 illustrates a partial sectional view of a display panel according to another embodiment of the present disclosure.

FIG. 9 illustrates a partial sectional view of a display panel 80 according to another embodiment of the present disclosure. The different from the embodiment of the display panel 70 in FIG. 8 may lie in the structure of the first transistor $I_{241}$.

Referring to FIG. 9, the first transistor $I_{241}$ includes a first active layer 2411, a first source 2412, a first drain 2413, and a first gate 2414. The first gate 2414 is located on an upper side of the first active layer 2411. The first transistor $I_{241}$ is also referred to as a top gate transistor. The second transistor $L_{242}$ includes a second active layer 2421, a second source 2422, a second drain 2423, and a second gate 2424. The second gate 2424 is located on an upper side of the second active layer 2421. The second transistor $L_{242}$ is also referred to as a top gate transistor. Therefore, the display panel 80 of this embodiment uses an oxide semiconductor transistor of a top gate in the visible region AA to match a polysilicon transistor of a top gate.

A substrate 201, a buffer layer 210, a first insulating layer 220, a second insulating layer 230, a first protective layer 250, a second protective layer 260, a reflective layer 270, a first pixel electrode 281, and a second pixel electrode 282 in FIG. 9 are respectively similar to the substrate 101, the buffer layer 110, the first insulating layer 120, the second insulating layer 130, the first protective layer 150, the second protective layer 160, the reflective layer 170, the first pixel electrode 181, and the second pixel electrode 182 in FIG. 8. The first pixel electrode 281 and the second pixel electrode 282 are respectively coupled to the first drain 2413 and the second drain 2423 by using through holes 291 and 292.

Figure 10:
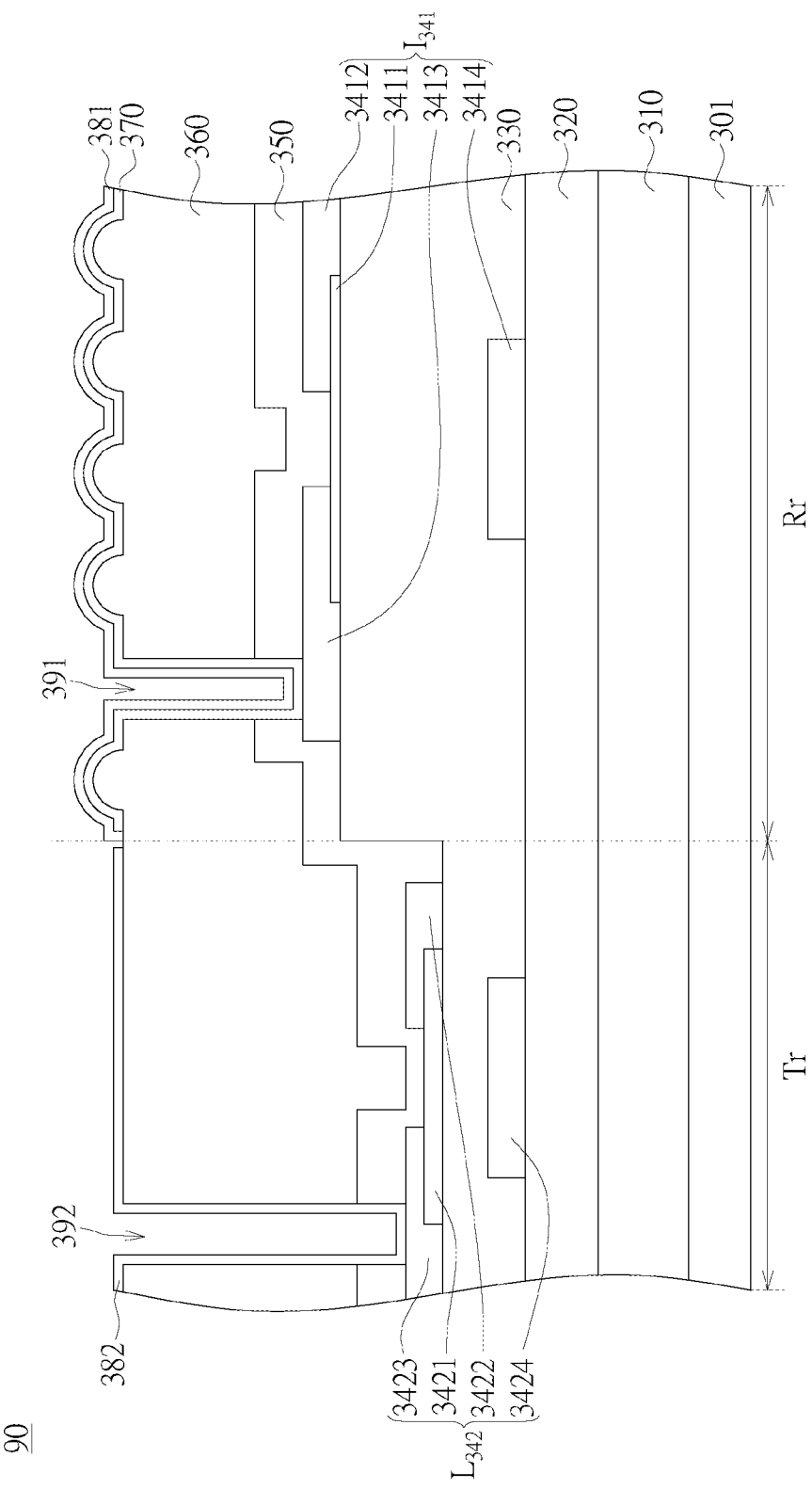
FIG. 10 illustrates a partial sectional view of a display panel according to another embodiment of the present disclosure.

FIG. 10 illustrates a partial sectional view of a display panel 90 according to another embodiment of the present disclosure. The difference from the embodiment of the display panel 70 in FIG. 8 lies in the structure of the second transistor $I_{342}$.

Referring to FIG. 10, the first transistor $I_{341}$ includes a first active layer 3411, a first source 3412, a first drain 3413, and a first gate 3414. The first gate 3414 is located on a lower side of the first active layer 3411. The first transistor $I_{341}$ is also referred to as a bottom gate transistor. The second transistor $I_{342}$ includes a second active layer 3421, a second source 3422, a second drain 3423, and a second gate 3424. The second gate 3424 is located on a lower side of the second active layer 3421. The second transistor $I_{342}$ is also referred to as a bottom gate transistor. Therefore, the display panel 90 of this embodiment uses an oxide semiconductor transistor of a bottom gate in the visible region AA to match a polysilicon transistor of a bottom gate.

A substrate 301, a buffer layer 310, a first insulating layer 320, a second insulating layer 330, a first protective layer 350, a second protective layer 360, a reflective layer 370, a first pixel electrode 381, and a second pixel electrode 382 in FIG. 10 are respectively similar to the substrate 101, the buffer layer 110, the first insulating layer 120, the second insulating layer 130, the first protective layer 150, the second protective layer 160, the reflective layer 170, the first pixel electrode 181, and the second pixel electrode 182 in FIG. 8. The first pixel electrode 381 and the second pixel electrode 382 are respectively coupled to the first drain 3413 and the second drain 3423 by using through holes 391 and 392.

Figure 11:
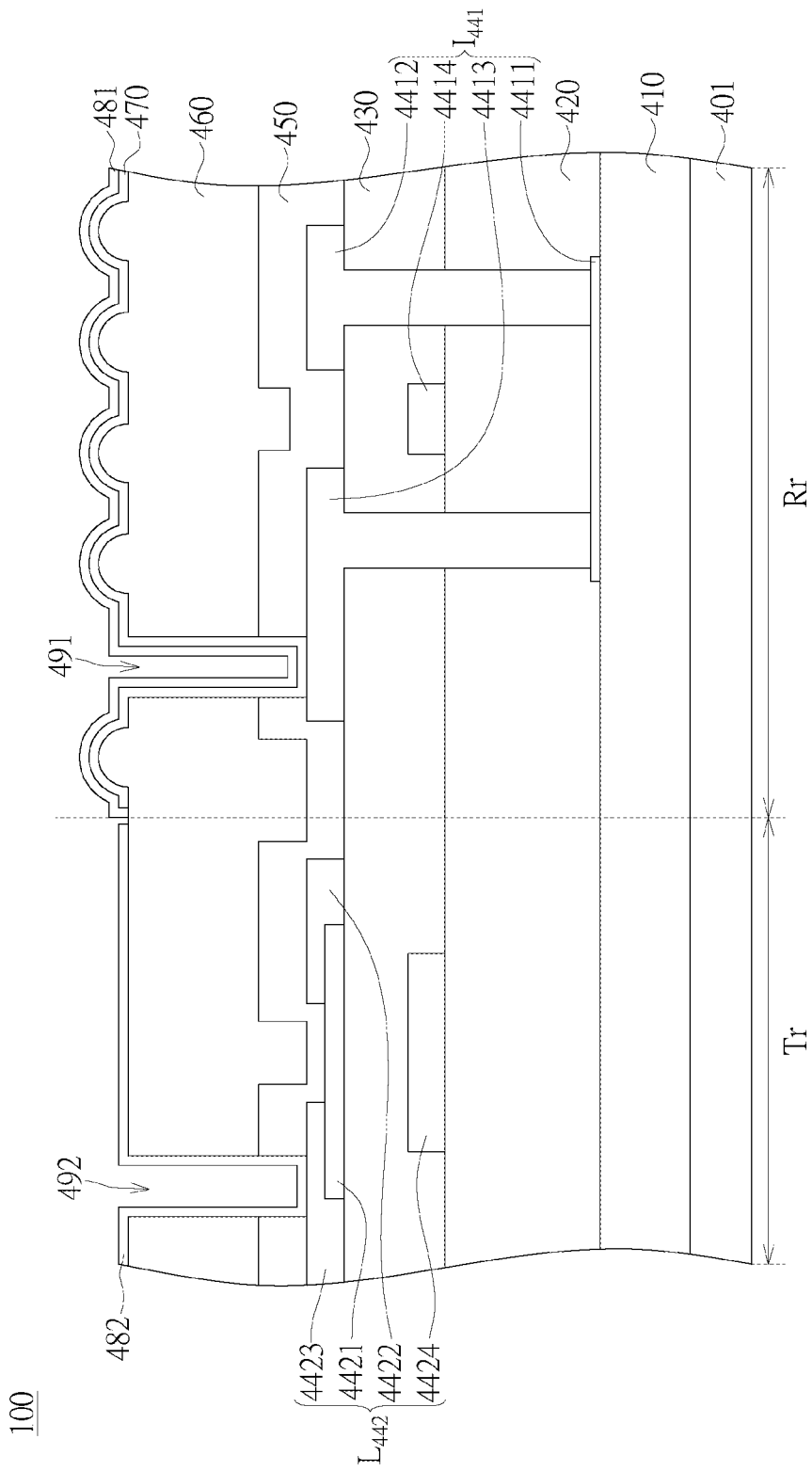
FIG. 11 illustrates a partial sectional view of a display panel according to another embodiment of the present disclosure.

FIG. 11 illustrates a partial sectional view of a display panel 100 according to another embodiment of the present disclosure. The difference from the embodiment of the display panel 70 in FIG. 8 lies in the structures of the first transistor $I_{441}$ and the second transistor $L_{442}$.

Referring to FIG. 11, the first transistor $I_{441}$ includes a first active layer 4411, a first source 4412, a first drain 4413, and a first gate 4414. The first gate 4414 is located on an upper side of the first active layer 4411. The first transistor $I_{441}$ is also referred to as a top gate transistor. The second transistor $L_{442}$ includes a second active layer 4421, a second source 4422, a second drain 4423, and a second gate 4424. The second gate 4424 is located on a lower side of the second active layer 4421. The second transistor $L_{442}$ is also referred to as a bottom gate transistor. Therefore, the display panel 100 of this embodiment uses an oxide semiconductor transistor of a top gate in the visible region AA to match a polysilicon transistor of a bottom gate.

A substrate 401, a buffer layer 410, a first insulating layer 420, a second insulating layer 430, a first protective layer 450, a second protective layer 460, a reflective layer 470, a first pixel electrode 481, and a second pixel electrode 482 in FIG. 11 are respectively similar to the substrate 101, the buffer layer 110, the first insulating layer 120, the second insulating layer 130, the first protective layer 150, the second protective layer 160, the reflective layer 170, the first pixel electrode 181, and the second pixel electrode 182 in FIG. 8. The first pixel electrode 481 and the second pixel electrode 482 are respectively coupled to the first drain 4413 and the second drain 4423 by using through holes 491 and 492.

The present disclosure provides a display panel. Because the display panel of the present disclosure includes a reflective region and a transmissible region, an oxide semiconductor transistor is selected for a first transistor I corresponding to the reflective region, and a polysilicon transistor is selected for a second transistor L corresponding to the transmissible region, so that by means of the feature of its low current leakage, the oxide semiconductor transistor can maintain an operation of a low frame rate when static images need to be rendered, to achieve a power-saving requirement, and by means of the feature of its high charging capability, the polysilicon transistor can execute an operation of a high frame rate when dynamic images need to be rendered, to achieve the objective of improving image quality of a video. Therefore, a display panel having excellent image quality and power-saving effects can be provided.

In conclusion, although the present invention has been disclosed in foregoing embodiments, they are not used to limit the present invention. A person of ordinary skill in the art can make various variations and modifications without departing from the spirit and scope of the present invention. Therefore, the protection scope of the present invention shall be subject to the appended claims.

What is claimed is:

1. A display panel, comprising:
    a substrate, comprising a reflective region and a transmissible region;
    a first transistor, disposed on the reflective region, and comprising a first active layer, wherein the first active layer comprises a first material;
    a second transistor, disposed on the transmissible region, and comprising a second active layer, wherein the second active layer comprises a second material that is different from the first material;
    a plurality of first transistors;
    a plurality of second transistors;
    a plurality of reflective regions;
    a plurality of transmissible regions;
    a plurality of data lines; and
    a plurality of scanning lines, wherein the plurality of scanning lines is interlaced with the plurality of data lines;
    wherein each of the first transistors and each of the second transistors are coupled to one of the data lines, one of the scanning lines, and one of the pixels;
    wherein the reflective regions and the transmissible regions are arranged into a matrix with a plurality of columns and a plurality of rows and are corresponding to the pixels; and
    wherein each of the data lines is only coupled to the first transistors or the second transistors;
    wherein the substrate is divided into a plurality of pixel groups, each of the pixel groups comprises a plurality of pixels, and each of the plurality of pixel groups contain either a set of serially connected first transistors or a set of serially connected second transistors.

2. The display panel according to claim 1, wherein the first active layer comprises an oxide semiconductor, and the second active layer comprises polysilicon.

3. The display panel according to claim 1, wherein each of the pixel groups further comprises:
    an $x^{th}$ data line, an $(x+1)^{th}$ data line, and an $(x+2)^{th}$ data line disposed sequentially along a first direction, wherein x is a positive integer;
    one of the first transistors, located between the $x^{th}$ data line and the $(x+1)^{th}$ data line and coupled to the $x^{th}$ data line; and
    one of the second transistors, located between the $(x+1)^{th}$ data line and the $(x+2)^{th}$ data line and coupled to the $(x+1)^{th}$ data line.

4. The display panel according to claim 1, wherein each of the pixel groups comprises:
    an $x^{th}$ data line, an $(x+1)^{th}$ data line, and an $(x+2)^{th}$ data line disposed sequentially along a first direction;
    an $m^{th}$ column and $n^{th}$ row of the first transistors and an $m^{th}$ column and $(n+1)^{th}$ row of the second transistors, located between the $x^{th}$ data line and the $(x+1)^{th}$ data line, wherein the $m^{th}$ column and $n^{th}$ row of the first transistors is coupled to the $(x+1)^{th}$ data line, and the $m^{th}$ column and $(n+1)^{th}$ row of the second transistors is coupled to the $x^{th}$ data line; and
    an $(m+1)^{th}$ column and nth row of the second transistors and an $(m+1)^{th}$ column and $(n+1)^{th}$ row of the first transistors, located between the $(x+1)^{th}$ data line and the $(x+2)^{th}$ data line, wherein the $(m+1)^{th}$ column and $n^{th}$ row of the second transistors is coupled to the $(x+2)^{th}$ data line, and the $(m+1)^{th}$ column and $(n+1)^{th}$ row of the first transistors is coupled to the $(x+1)^{th}$ data line, wherein x, m, and n are positive integers.

5. The display panel according to claim 1, wherein each of the pixel groups comprises:
    an $x^{th}$ data line, an $(x+1)^{th}$ data line, and an $(x+2)^{th}$ data line disposed sequentially along a first direction;
    an $m^{th}$ column and $n^{th}$ row of the second transistors, an $(m+1)^{th}$ column and $n^{th}$ row of the second transistors, an $m^{th}$ column and $(n+1)^{th}$ row of the first transistors, and an $(m+1)^{th}$ column and $(n+1)^{th}$ row of the first transistors, located between the $x^{th}$ data line and the $(x+1)^{th}$ data line, wherein the $(m+1)^{th}$ column and $n^{th}$ row of the second transistors is coupled to the $x^{th}$ data line via the $m^{th}$ column and nth row of the second transistors, and the $m^{th}$ column and $(n+1)^{th}$ row of the first transistors is coupled to the $(x+1)^{th}$ data line via the $(m+1)^{th}$ column and $(n+1)^{th}$ row of the first transistors; and an $(m+2)^{th}$ column and nth row of the first transistors, an $(m+3)^{th}$ column and $n^{th}$ row of the first transistors, an $(m+2)^{th}$ column and $(n+1)^{th}$ row of the second transistors, and an $(m+3)^{th}$ column and $(n+1)^{th}$ row of the second transistors, located between the $(x+1)^{th}$ data line and the $(x+2)^{th}$ data line, wherein the $(m+3)^{th}$ column and $n^{th}$ row of the first transistors is coupled to the $(x+1)^{th}$ data line via the $(m+2)^{th}$ column and nth row of the first transistors, and the $(m+2)^{th}$ column and $(n+1)^{th}$ row of the second transistors is coupled to the $(x+2)^{th}$ data line via the $(m+3)^{th}$ column and $(n+1)^{th}$ row of the second transistors, wherein x, m, and n are positive integers.

6. The display panel claim 1, wherein each of the pixel groups comprises:

an $x^{th}$ data line, an $(x+1)^{th}$ data line, an $(x+2)^{th}$ data line, and an $(x+3)^{th}$ data line disposed sequentially along a first direction;

an $m^{th}$ column and $(n+1)^{th}$ row of the first transistors and an $(m+1)^{th}$ column and $n^{th}$ row of the first transistors, located between the $x^{th}$ data line and the $(x+2)^{th}$ data line, wherein the $(m+1)^{th}$ column and $n^{th}$ row of the first transistors is coupled to the $x^{th}$ data line by using the $m^{th}$ column and $(n+1)^{th}$ row of the first transistors; and an $(m+1)^{th}$ column and $(n+1)^{th}$ row of the second transistors and an $(m+2)^{th}$ column and $n^{th}$ row of the second transistors, located between the $(x+1)^{th}$ data line and the $(x+3)^{th}$ data line, wherein the $(m+2)^{th}$ column and $n^{th}$ row of the second transistors is coupled to the $(x+1)^{th}$ data line by using the $(m+1)^{th}$ column and $(n+1)^{th}$ row of the second transistors, wherein x, m, and n are positive integers.

7. The display panel according to claim 1, wherein each of the pixel groups comprises:

an $x^{th}$ data line, an $(x+1)^{th}$ data line, an $(x+2)^{th}$ data line, and an $(x+3)^{th}$ data line disposed sequentially along a first direction;

an $m^{th}$ column and $n^{th}$ row of the first transistors and an $(m+3)^{th}$ column and $n^{th}$ row of the first transistors, located between the $x^{th}$ data line and the $(x+2)^{th}$ data line, wherein the $(m+3)^{th}$ column and $n^{th}$ row of the first transistors is coupled to the $x^{th}$ data line by using the $m^{th}$ column and $n^{th}$ row of the first transistors; and an $(m+2)^{th}$ column and nth row of the second transistors and an $(m+5)^{th}$ column and $n^{th}$ row of the second transistors, located between the $(x+1)^{th}$ data line and the $(x+3)^{th}$ data line, wherein the $(m+5)^{th}$ column and $n^{th}$ row of the second transistors is coupled to the $(x+1)^{th}$ data line by using the $(m+2)^{th}$ column and $n^{th}$ row of the second transistors, wherein x, m, and n are positive integers.

8. The display panel according to claim 1, wherein each of the pixel groups comprises:

an $x^{th}$ data line, an $(x+1)^{th}$ data line, an $(x+2)^{th}$ data line, and an $(x+3)^{th}$ data line disposed sequentially along a first direction, wherein extension directions of the $x^{th}$ data line, the $(x+1)^{th}$ data line, the $(x+2)^{th}$ data line, and the $(x+3)^{th}$ data line are partially parallel to the first direction, and partially parallel to a second direction approximately perpendicular to the first direction;

an $(m+5)^{th}$ column and $(n+1)^{th}$ row of the first transistors located between the $(x+1)^{th}$ data line and the $(x+2)^{th}$ data line, and an $(m+4)^{th}$ column and $(n+2)^{th}$ row of the first transistors and an $(m+6)^{th}$ column and $n^{th}$ row of the first transistors located between the $(x+2)^{th}$ data line and the $(x+3)^{th}$ data line, wherein the $(m+6)^{th}$ column and nth row of the first transistors is coupled to the $(x+2)^{th}$ data line by using the $(m+4)^{th}$ column and $(n+2)^{th}$ row of the first transistors and the $(m+5)^{th}$ column and $(n+1)^{th}$ row of the first transistors;

an $(m+2)^{th}$ column and $(n+1)^{th}$ row of the second transistors located between the $x^{th}$ data line and the $(x+1)^{th}$ data line, and an $(m+1)^{th}$ column and $(n+2)^{th}$ row of the second transistors and an $(m+3)^{th}$ column and nth row of the second transistors located between the $(x+1)^{th}$ data line and the $(x+2)^{th}$ data line, wherein the $(m+3)^{th}$ column and $n^{th}$ row of the second transistors is coupled to the $(x+1)^{th}$ data line by using the $(m+1)^{th}$ column and $(n+2)^{th}$ row of the second transistors and the $(m+2)^{th}$ column and $(n+1)^{th}$ row of the second transistors, wherein x, m, and n are positive integers.

9. The display panel according to claim 1, further comprising:

a reflective layer, located on the reflective region;

a first pixel electrode, located on the reflective region and coupled to the first transistor; and a second pixel electrode, located on the transmissible region and coupled to the second transistor.

10. The display panel according to claim 1, wherein each of the data lines are disposed sequentially along a first direction, have a winding shape, and extend in both the first direction and a second direction orthogonal to the first direction.

11. The display panel according to claim 10, wherein each of the data lines are coupled to the first transistors or the second transistors of pixels in three successive different rows.

12. The display panel according to claim 1, wherein the respective first or second transistors of each set of serially connected first or second transistors are arranged in different rows and columns of the matrix.

13. The display panel according to claim 1, wherein each of the plurality of pixel groups contain a red pixel, a green pixel, and a blue pixel.

* * * * *